(12) United States Patent
Horiguchi et al.

(10) Patent No.: US 8,227,172 B2
(45) Date of Patent: Jul. 24, 2012

(54) METHOD OF PRODUCING SEMICONDUCTOR DEVICE USING RESIST UNDERLAYER FILM BY PHOTO-CROSSLINKING CURING

(75) Inventors: Yusuke Horiguchi, Toyama (JP); Satoshi Takei, Toyama (JP); Tetsuya Shinjo, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 322 days.

(21) Appl. No.: 12/311,745

(22) PCT Filed: Oct. 10, 2007

(86) PCT No.: PCT/JP2007/069740
§ 371 (c)(1),
(2), (4) Date: Aug. 31, 2009

(87) PCT Pub. No.: WO2008/047638
PCT Pub. Date: Apr. 24, 2008

(65) Prior Publication Data
US 2010/0022092 A1    Jan. 28, 2010

(30) Foreign Application Priority Data
Oct. 12, 2006  (JP) .................................. 2006-279056

(51) Int. Cl.
G03F 7/00 (2006.01)
G03F 7/004 (2006.01)
G03F 7/11 (2006.01)
G03F 7/26 (2006.01)
G03F 7/40 (2006.01)

(52) U.S. Cl. .................. 430/273.1; 430/270.1; 430/311; 430/330; 430/331; 430/927; 430/913

(58) Field of Classification Search ............... 430/270.1, 430/271.1, 311, 927, 913
See application file for complete search history.

(56) References Cited

U.S. PATENT DOCUMENTS

| | | | |
|---|---|---|---|
| 5,919,599 A | 7/1999 | Meador et al. | |
| 5,939,236 A | 8/1999 | Pavelchek et al. | |
| 7,037,994 B2 * | 5/2006 | Sugita et al. | 526/284 |
| 7,211,519 B2 * | 5/2007 | Takigawa et al. | 438/736 |
| 7,226,721 B2 * | 6/2007 | Takei et al. | 430/271.1 |
| 7,326,509 B2 * | 2/2008 | Arase et al. | 430/270.1 |
| 7,563,563 B2 * | 7/2009 | Chen et al. | 430/326 |
| 2003/0129542 A1 | 7/2003 | Shih et al. | |
| 2003/0215736 A1 * | 11/2003 | Oberlander et al. | 430/270.1 |
| 2004/0034155 A1 | 2/2004 | Sugita et al. | |
| 2004/0197709 A1 | 10/2004 | Arase et al. | |
| 2005/0008964 A1 | 1/2005 | Takei et al. | |
| 2007/0238029 A1 * | 10/2007 | Takei et al. | 430/5 |
| 2011/0076626 A1 * | 3/2011 | Padmanaban et al. | 430/326 |

FOREIGN PATENT DOCUMENTS

| | | |
|---|---|---|
| CN | 1545645 A | 11/2004 |
| CN | 1615302 A | 5/2005 |
| EP | 1 386 904 A1 | 2/2004 |
| JP | A-08-255736 | 10/1996 |
| JP | A-11-133618 | 5/1999 |
| JP | A-2000-294504 | 10/2000 |
| JP | A-2002-047430 | 2/2002 |
| JP | A-2002-128847 | 5/2002 |
| JP | A-2002-190519 | 7/2002 |
| JP | A-2004-168748 | 6/2004 |
| JP | A-2005-508089 | 3/2005 |
| WO | WO 02/05035 A1 | 1/2002 |
| WO | WO 03/017002 A1 | 2/2003 |
| WO | WO 03/034152 A1 | 4/2003 |
| WO | WO 2006003850 A1 * | 1/2006 |
| WO | WO 2006/049045 A1 | 5/2006 |
| WO | WO 2006/115044 A1 | 11/2006 |

OTHER PUBLICATIONS

Schmaljohann et al., "Design Strategies for 157 nm Single-Layer Photoresists: Lithographic Evaluation of a Poly($\alpha$-trifluoromethyl vinyl alcohol) Copolymer," *Advances in Resist Technology and Processing XVII: Proceedings of SPIE*, 2000, pp. 330-334, vol. 3999.
Crawford et al., "New Materials for 157 nm Photoresists: Characterization and Properties," *Advances in Resist Technology and Processing XVII: Proceedings of SPIE*, 2000, pp. 357-364, vol. 3999.
Patterson et al., "Polymers for 157 nm Photoresist Applications: A Progress Report," *Advances in Resist Technology and Processing XVII: Proceedings of SPIE*, 2000, pp. 365-374, vol. 3999.
English translation of Office Action issued Mar. 17, 2011 in Chinese Patent Application No. 200780037165.4.
English translation of Office Action issued Dec. 12, 2011 in Chinese Patent Application No. 200780037165.4.

* cited by examiner

*Primary Examiner* — Amanda C. Walke
(74) *Attorney, Agent, or Firm* — Oliff & Berridge, PLC

(57) ABSTRACT

There is provided a resist underlayer film forming composition used in a lithography process for producing semiconductor devices. A method of producing a semiconductor device comprising: forming a coating film by applying a resist underlayer film forming composition containing a polymer, a crosslinker and a photoacid generator on a semiconductor substrate; forming an underlayer film by irradiating light to the coating film; and forming a photoresist by applying a photoresist composition on the underlayer film and heating the resultant layer. The polymer polymer is a polymer having a benzene ring or a hetero ring in a main chain or a side chain bonded to the main chain, and the content rate of a benzene ring in the polymer is 30 to 70% by mass. The polymer may be a polymer containing a lactone structure.

3 Claims, No Drawings

METHOD OF PRODUCING SEMICONDUCTOR DEVICE USING RESIST UNDERLAYER FILM BY PHOTO-CROSSLINKING CURING

TECHNICAL FIELD

The present invention relates to a method of forming an underlayer film between a semiconductor substrate and a photoresist by photo-crosslinking. In detail, the present invention relates to a method of producing a semiconductor device including: forming an underlayer film used as a photoresist underlayer in a lithography process for producing semiconductor devices by irradiating light. In addition, the present invention relates to a method of forming an underlayer film using the underlayer film forming composition and a method of forming a photoresist pattern.

BACKGROUND ART

Conventionally, in the production of a semiconductor device, fine processing by lithography using a photoresist has been performed. The fine processing is a processing method of forming fine convexoconcave corresponding to the following pattern on the surface of a substrate by forming a thin film of a photoresist on a semiconductor substrate, such as silicon wafer; irradiating an activating light ray, such as an ultraviolet ray onto the resultant thin film through a mask pattern in which a pattern of a semiconductor device is depicted, to develop; and subjecting the substrate to etching processing using the resultant photoresist pattern as a protecting film. Recently, the high integration of semiconductor devices is progressed and the activating light ray to be used tends to have a shorter wavelength, such as from a KrF excimer laser (248 nm) to an ArF excimer laser (193 nm). Following such a tendency, the influence of diffuse reflection of an activating light ray from the substrate or the influence of a standing wave has become a large problem. Thus, in order to solve this problem, widely studied is a method of providing a reflection preventing film (bottom anti-reflective coating) between the photoresist and the substrate. For such a reflection preventing film, many investigations on an organic reflection preventing film have been performed in terms of easiness of its use or the like (for example, see Patent Document 1).

Further, recently, for solving a problem of the wiring delay which has become apparent as the miniaturization of a pattern rule of the semiconductor device has progressed, it is studied to use copper as a wiring material. In addition, together with the study, a dual damascene process is studied as a wiring forming method for the semiconductor substrate. Then, in the dual damascene process, a via hole is formed and a reflection preventing film is formed to a substrate having a large aspect ratio. Therefore, for the reflection preventing film used in this process, filling characteristics capable of filling holes without voids, planarization characteristics capable of forming a planar film on the substrate surface, and the like are required. However, it is difficult to apply an organic material for a reflection preventing film to a substrate having a large aspect ratio and recently, materials focusing on the filling characteristics and the planarization characteristics have been developed (for example, see Patent Document 2, Patent Document 3, Patent Document 4 and Patent Document 5).

In addition, in the production of devices such as semiconductor devices, for reducing the poisoning effect of a photoresist by a dielectric layer, there is disclosed a method of providing a barrier layer formed from a composition containing crosslinkable polymers or the like between the dielectric layer and the photoresist (for example, Patent Document 6).

Thus, in the production of semiconductor devices in recent years, for achieving various effects besides the reflection preventing effect, as a layer between the semiconductor substrate and the photoresist, that is, as an underlayer of the photoresist, an organic underlayer film formed from a composition containing organic compounds has become disposed.

And now, these organic underlayer films are generally formed by applying an underlayer film forming composition on a semiconductor substrate and then by heating the semiconductor substrate at a high temperature of around 170 to 200° C. Therefore, there is such a problem that during heating at a high temperature, low molecular mass components contained in an underlayer film forming composition are volatilized or sublimated, and are attached to peripheral devices to contaminate the devices. In addition, there is also such a problem that the components attached to the devices fall onto a semiconductor substrate to adversely affect a pattern forming.

[Patent Document 1]
  U.S. Pat. No. 5,919,599 Specification
[Patent Document 2]
  Japanese Patent Application Publication No. JP-A-2000-294504
[Patent Document 3]
  Japanese Patent Application Publication No. JP-A-2002-47430
[Patent Document 4]
  Japanese Patent Application Publication No. JP-A-2002-190519
[Patent Document 5]
  Publication No. WO 02/05035 pamphlet
[Patent Document 6]
  Japanese Patent Application Publication No. JP-A-2002-128847

DISCLOSURE OF THE INVENTION

[Problems to be Solved by the Invention]

It is an object of the present invention to provide a method of forming an underlayer film used as a photoresist underlayer film in a lithography process for producing semiconductor devices by irradiating light, and to provide a method of forming a photoresist pattern using the method.

In addition, another object of the present invention is to provide a method of forming an underlayer film causing no intermixing with a photoresist applied and formed as an upper layer thereof and having a larger dry etching rate than that of the photoresist.

Further, still another object of the present invention is to provide a method of forming by irradiating light, an underlayer film capable of being used in a lithography process for producing semiconductor devices, for example, as an underlayer reflection preventing film for reducing the reflection of exposure irradiation light, which is irradiated to a photoresist formed on a semiconductor substrate, from the substrate, as a planarizing film for planarizing a semiconductor substrate having unevenness, and as a film for preventing contamination of a photoresist due to substances generated from a semiconductor substrate during heating or the like.

Further, still another object of the present invention is to provide a method of filling holes having an aspect ratio, which is expressed by height/diameter formed on a semiconductor substrate, of 1 or more with an underlayer film formed by irradiating light.

Further, still another object of the present invention is to provide a method of forming an underlayer film by irradiating light without heating at a high temperature.

[Means for Solving the Problems]

The present invention provides, according to a first aspect, a method of producing a semiconductor device including: forming a coating film by applying a resist underlayer film forming composition containing a polymer, a crosslinker and a photoacid generator on a semiconductor substrate; forming an underlayer film by irradiating light to the coating film; and forming a photoresist by applying a photoresist composition on the underlayer film and heating the resultant layer;

according to a second aspect, a method of producing a semiconductor device including: forming a coating film by applying a resist underlayer film forming composition containing a polymer, a crosslinker and a photoacid generator on a semiconductor substrate; forming an underlayer film by irradiating light to the coating film; forming a photoresist by applying a photoresist composition on the underlayer film and heating the resultant layer; exposing the semiconductor substrate coated with the underlayer film and the photoresist to light; developing the photoresist after the exposure; dry etching the underlayer film using a developed resist pattern; and processing the semiconductor substrate with the obtained resist pattern;

according to a third aspect, in the method of producing a semiconductor device according to the first aspect or the second aspect, the polymer is a polymer having a benzene ring, a hetero ring or a combination of the benzene ring and the hetero ring in a main chain or a side chain bonded to the main chain;

according to a fourth aspect, in the method of producing a semiconductor device according to any one of the first aspect to the third aspect, the content rate of a benzene ring in the polymer is 30 to 70% by mass;

according to a fifth aspect, in the method of producing a semiconductor device according to any one of the first aspect to the fourth aspect, the polymer is a polymer containing a lactone structure;

according to a sixth aspect, in the method of producing a semiconductor device according to any one of the first aspect to the fifth aspect, the polymer has at least a unit structure represented by Formula (1):

[Chemical Formula 1]

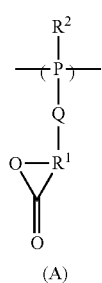

Formula (1)

(in Formula (1), Q represents a divalent linking group linking P with $R^1$; $R^1$ represents a trivalent hydrocarbon group having 2 to 4 carbon atoms; P represents a bonding group constituting a main chain; and $R^2$ represents a hydrogen atom, a methyl group or a halogen atom);

according to a seventh aspect, in the method of producing a semiconductor device according to any one of the first aspect to the sixth aspect, the polymer is composed of a polymer represented by Formula (2):

[Chemical Formula 2]

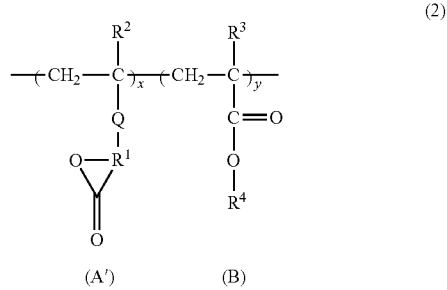

(where x and y represent the number of repeating units and x=5 to 5,000, y=2 to 5,000; Q represents a divalent linking group linking a carbon atom constituting a main chain with $R^1$; $R^1$ represents a trivalent hydrocarbon group having 2 to 4 carbon atoms; $R^2$ and $R^3$ represent a hydrogen atom, a methyl group or a halogen atom; $R^4$ represents a hydrogen atom, an unsubstituted or substituted alkyl group having 1 to 10 carbon atoms, an unsubstituted or substituted aralkyl group, an unsubstituted or substituted carbocyclic aromatic group, or an unsubstituted or substituted heterocyclic aromatic group; and an amount of a structural unit (A') is 1 to 76 mol % and an amount of a structural unit (B) is 99 to 24 mol %);

according to an eighth aspect, in the method of producing a semiconductor device according to any one of the first aspect to the seventh aspect, the polymer has a structure having absorption at 248 nm, 193 nm or 157 nm; and according to a ninth aspect, in the method of producing a semiconductor device according to any one of the first aspect to the eighth aspect, the crosslinker has at least two crosslinkage forming functional groups.

[Effects of the Invention]

According to the method of the present invention, by irradiating light, an excellent underlayer film having a dry etching rate larger than that of a photoresist and causing no intermixing with a photoresist can be formed.

In addition, with the resist underlayer film forming composition used in the present invention, the surface of a semiconductor substrate having holes which have an aspect ratio expressed by height/diameter of 1 or more can be planarized. Therefore, the homogeneity of the film thickness of a photoresist or the like applied and formed on the substrate can be enhanced. Then, even in a process using a substrate having holes, an advantageous photoresist pattern can be formed.

With the resist underlayer film forming composition used in the present invention, holes formed in a semiconductor substrate can be filled with an underlayer film without causing voids.

In addition, with the underlayer film forming composition used in the present invention, an underlayer film can be formed by irradiating light without heating at a high temperature. Therefore, the contamination of peripheral devices due to volatilization or sublimation of low molecular mass components contained in the underlayer film forming composition can be prevented. When the low molecular mass components are volatilized or sublimated, it is feared that the sublimated components are attached to the inside of a draft chamber and before long, these components fall onto a semiconductor substrate to cause a failure in a semiconductor. However, in the method according to the present invention, since heating at a high temperature is not necessary, even when low molecular mass components are used in a resist underlayer film forming composition, there is no fear of generating a sublimate or the like, so that a relatively large amount of low molecular mass components can be used in a resist underlayer film forming composition. Therefore, an underlayer film can be formed using a resist underlayer film forming composition having a relatively low viscosity. Then, a resist underlayer film excellent in filling property of holes and planarizing property of a semiconductor substrate can be formed.

BEST MODES FOR CARRYING OUT THE INVENTION

The present invention is a method of producing a semiconductor device including: forming a coating film by applying a resist underlayer film forming composition containing a polymer, a crosslinker and a photoacid generator on a semiconductor substrate; forming an underlayer film by irradiating light to the coating film; forming a photoresist by applying a photoresist composition on the underlayer film and by heating the resultant coating film.

The resist underlayer film used in the present invention contains a polymer having a benzene ring, a hetero ring or a combination thereof in the main chain constituting the polymer or side chains bonded to the main chain. This polymer is preferably a polymer having a benzene ring, a hetero ring or a combination thereof in side chains bonded to the main chain constituting the polymer.

This underlayer film has preferably a content rate of a benzene ring in the polymer of 30 to 70% by mass.

The resist underlayer film is formed by applying a resist underlayer film forming composition to a semiconductor substrate and by removing a solvent by calcination. The resist underlayer film forming composition contains a polymer, a crosslinker, a photoacid generator and a solvent, and the solid content of a resist underlayer film forming composition containing a crosslinking catalyst and a surfactant as arbitrary components is 0.1 to 50% by mass, or 5 to 40% by mass, or 10 to 30% by mass. Here, the solid content means a remained component after subtracting a solvent component from all components of the resist underlayer film forming composition.

In the resist underlayer film forming composition, the amount of the polymer is 10% by mass or more, for example, 30% by mass to 99% by mass, 50% by mass to 99% by mass, 65% by mass to 99% by mass, based on the mass of the solid content.

The polymer is preferably a resin containing a lactone structure. As the polymer, there can be used a polymer in which a γ (gamma)-lactone structure taking a 5-membered ring structure or a δ (delta)-lactone structure taking a 6-membered ring structure is introduced into the main chain or side chains linked to the main chain.

The molecular mass of the polymer varies depending on the used coating solvent, the solution viscosity, the film shape or the like, however, is a weight average molecular mass of 1,000 to 1,000,000, preferably 1,000 to 200,000, more preferably 1,000 to 100,000.

The γ-lactone used in the polymer is a lactone having a 5-membered ring structure and examples thereof can include unsubstituted or substituted γ-lactones such as γ-butylolactone, γ-valerolactone and tetonic acid.

In addition, the δ-lactone is a lactone having a 6-membered ring structure and examples thereof can include unsubstituted or substituted δ-lactones such as δ-valerolactone and δ-caprolactone.

As the polymer, for example, a resin in which a compound having a lactone structure is bonded to side chains linked to the main chain can be used, and such a resin has at least a structural unit of Formula (1).

In Formula (1), Q represents a divalent linking group linking P with $R^1$, and $R^1$ represents a trivalent hydrocarbon group having 2 to 4 carbon atoms and constitutes a lactone ring. P represents a bonding group constituting the main chain, and $R^2$ represents a hydrogen atom, a methyl group or a halogen atom. The trivalent hydrocarbon group represented by $R^1$ having 2 to 4 carbon atoms constitutes a lactone ring and is bonded with P at one position of the hydrocarbon group through Q. There are a case where the hydrocarbon group has substituents and a case where the hydrocarbon group is unsubstituted.

The polymer having a structure of Formula (1) can be produced by reacting, for example, an acrylic resin such as acrylic acid, halogenated acrylic acid, and methacrylic acid with a lactone such as α-bromo-γ-butylolactone and α-bromo-δ-valerolactone.

Then, the polymer used in the present invention can take a structure of Formula (2) in which a copolymer that is a combination of a structural unit having an acrylic resin as a main chain and having γ-lactone or derivatives thereof, or δ-lactone or derivatives thereof as side chains with a structural unit of an acrylic resin, is formed.

The copolymer contains preferably 1 to 76 mol % of a structural unit (A') and 99 to 24 mol % of a structural unit (B). In Formula (2), x and y represent the numbers of repeating units, and x=5 to 5,000 and y=2 to 5,000; Q represents a divalent linking group linking a carbon atom constituting the main chain with $R^1$; and $R^1$ represents a trivalent hydrocarbon group having 2 to 4 carbon atoms and constitutes a lactone ring. There are a case where the hydrocarbon group has substituents and a case where the hydrocarbon group is unsubstituted. $R^2$ and $R^3$ represent a hydrogen atom, a methyl group or a halogen atom, and $R^4$ represents a hydrogen atom, an unsubstituted or substituted alkyl group having 1 to 10 carbon atoms, an unsubstituted or substituted aralkyl group, an unsubstituted or substituted carbocyclic aromatic group, or an unsubstituted or substituted heterocyclic aromatic group.

Preferred examples of the alkyl group represented by $R^4$ include methyl, ethyl, n-propyl, i-propyl, cyclopropyl, n-butyl, i-butyl, s-butyl, t-butyl, cyclobutyl, 1-methyl-cyclopropyl, 2-methyl-cyclopropyl, n-pentyl, 1-methyl-n-butyl, 2-methyl-n-butyl, 3-methyl-n-butyl, 1,1-dimethyl-n-propyl, 1,2-dimethyl-n-propyl, 2,2-dimethyl-n-propyl, 1-ethyl-n-propyl, cyclopentyl, 1-methyl-cyclobutyl, 2-methyl-cyclobutyl, 3-methyl-cyclobutyl, 1,2-dimethyl-cyclopropyl, 2,3-dimethyl-cyclopropyl, 1-ethyl-cyclopropyl, 2-ethyl-cyclopropyl, n-hexyl, 1-methyl-n-pentyl, 2-methyl-n-pentyl, 3-methyl-n-pentyl, 4-methyl-n-pentyl, 1,1-dimethyl-n-butyl, 1,2-dimethyl-n-butyl, 1,3-dimethyl-n-butyl, 2,2-dimethyl-n-butyl, 2,3-dimethyl-n-butyl, 3,3-dimethyl-n-butyl, 1-ethyl-n-butyl, 2-ethyl-n-butyl, 1,1,2-trimethyl-n-propyl, 1,2,2-trimethyl-n-propyl, 1-ethyl-1-methyl-n-propyl, 1-ethyl-2-methyl-n-propyl, cyclohexyl, 1-methyl-cyclopentyl, 2-methyl-cyclopentyl, 3-methyl-cyclopentyl, 1-ethyl-cyclobutyl, 2-ethyl-cyclobutyl, 3-ethyl-cyclobutyl, 1,2-dimethyl-cyclobutyl, 1,3-dimethyl-cyclobutyl, 2,2-dimethyl-cyclobutyl, 2,3-dimethyl-cyclobutyl, 2,4-dimethyl-cyclobutyl, 3,3-dimethyl-cyclobutyl, 1-n-propyl-cyclopropyl, 2-n-propyl-cyclopropyl, 1-i-propyl-cyclopropyl, 2-i-propyl-cyclopropyl, 1,2,2-trimethyl-cyclopropyl, 1,2,3-trimethyl-cyclopropyl, 2,2,3-trimethyl-cyclopropyl, 1-ethyl-2-methyl-cyclopropyl, 2-ethyl-1-methyl-cyclopropyl, 2-ethyl-2-methyl-cyclopropyl and 2-ethyl-3-methyl-cyclopropyl. In addition, examples of the alkyl group can include alkyl groups substituted with a hydroxyl group such as hydroxyethyl, hydroxypropyl and hydroxybutyl, and alkyl groups substituted with a halogen atom such as trichloroethyl and trifluoroethyl.

The aralkyl group preferably includes a benzyl group, an o-methylbenzyl group, an m-methylbenzyl group, a p-methylbenzyl group, an o-chlorobenzyl group, an m-chlorobenzyl group, a p-chlorobenzyl group, an o-fluorobenzyl group, a p-fluorobenzyl group, an o-methoxybenzyl group, a p-methoxybenzyl group, a p-nitrobenzyl group, a p-cyanobenzyl group, a phenetyl group, an o-methylphenetyl group, an m-methylphenetyl group, a p-methylphenetyl group, an o-chlorophenetyl group, an m-chlorophenetyl group, a p-chlorophenetyl group, an o-fluorophenetyl group, a p-fluorophenetyl group, an o-methoxyphenetyl group, a p-methoxyphenetyl group, a p-nitrophenetyl group, a p-cyanophenetyl group, a 3-phenylpropyl group, a 4-phenylbutyl group, a 5-phenylpentyl group, a 6-phenylhexyl group, an α-naphthylmethyl group, a β-naphthylmethyl group, an o-biphenylylmethyl group, an m-biphenylylmethyl group, a p-biphenylylmethyl group, a 1-anthrylmethyl group, a 2-anthrylmethyl group, a 9-anthrylmethyl group, a 1-phenanthrylmethyl group, a 2-phenanthrylmethyl group, a 3-phenanthrylmethyl group, a 4-penanthrylmethyl group, a 9-phenanthrylmethyl group, an α-naphthylethyl group, a β-naphthylethyl group, an o-biphenylylethyl group, an m-biphenylylethyl group, a p-biphenylylethyl group, a 1-anthrylethyl group, a 2-anthrylethyl group, a 9-anthrylethyl group, a 1-phenanthrylethyl group, a 2-phenanthrylethyl group, a 3-phenanthrylethyl group, a 4-phenanthrylethyl group and a 9-phenanthrylethyl group.

Then, the carbocyclic aromatic group preferably include a phenyl group, an o-methylphenyl group, an m-methylphenyl group, a p-methylphenyl group, an o-chlorophenyl group, an m-chlorophenyl group, a p-chlorophenyl group, an o-fluorophenyl group, a p-fluorophenyl group, a o-methoxyphenyl group, a p-methoxyphenyl group, a p-nitrophenyl group, a p-cyanophenyl group, an α-naphthyl group, a β-naphthyl group, an o-biphenylyl group, an m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group and a 9-phenanthryl group.

Preferred examples of the heterocyclic aromatic group can include pyridyl, quinolinyl and quinoxalinyl. $R^4$ can be used individually or in combination.

Also in Formula (2), $R^1$ represents a trivalent hydrocarbon group having 2 to 4 carbon atoms, constitutes a lactone ring and is bonded with a carbon atom of the main chain at one position of the hydrocarbon group through Q. In addition, there are a case where the hydrocarbon group is unsubstituted and a case where the hydrocarbon group has substituents.

In resins of Formula (1) and Formula (2), structural units (A) and (A') having a lactone structure are essential structures.

Formula (2) represents a copolymer resin containing a structural unit (A') having a lactone structure in side chains of an acrylic resin and a structural unit (B) of an acrylic resin. The amount of the structural unit (A') is 1 to 76 mol % and the amount of the structural unit (B) is 99 to 24 mol %, based on the amount of a copolymer (2).

Here, $R^1$ represents a trivalent hydrocarbon group having 2 to 4 carbon atoms and constitutes a lactone ring; R2 and $R^3$ represent a hydrogen atom, a methyl group or a halogen atom; and $R^4$ represents a hydrogen atom, an unsubstituted or substituted alkyl group having 1 to 10 carbon atoms, an unsubstituted or substituted aralkyl group, an unsubstituted or substituted carbocyclic aromatic group or an unsubstituted or substituted heterocyclic aromatic group.

Preferred examples of the alkyl group of $R^4$ can include: a straight chain alkyl group such as methyl, ethyl, n-propyl and n-butyl; a branched alkyl group such as i-propyl, i-butyl and 2-ethylhexyl; an alicyclic alkyl group such as cyclopentyl and cyclohexyl; an alkyl group substituted with a hydroxyl group such as hydroxyethyl, hydroxypropyl and hydroxybutyl; and an alkyl group substituted with a halogen atom such as trichloroethyl and trifluoroethyl. Preferred examples of the aralkyl group can include a benzyl, 2-phenylethyl, naphthylmethyl and anthracenylmethyl group. Then, preferred examples of the carbocyclic aromatic group can include a phenyl, naphthyl and anthracenyl group, and preferred examples of the heterocyclic aromatic group can include a pyridyl, quinolinyl and quinoxalinyl group. Particularly, an alkyl group having a hydroxyl group such as a hydroxyethyl group, a hydroxypropyl group and a hydroxybutyl group is preferred. $R^4$ can be used individually or in combination.

In addition, when a polymer of Formula (2) is used for a resist underlayer film, according to the increase of the introduced amount of a structural unit (A') containing a γ-lactone structure, a δ-lactone structure or a combination thereof, the dry etching rate is increased. The preferred ratio of the amount of the structural unit (A') is 1 to 76 mol % based on the amount of the copolymer (2), and the amount of the structural unit (B) of an acrylic monomer is 99 to 24 mol % based on the amount of the copolymer (2).

The method of obtaining the resin represented by Formula (2) include: a method of copolymerizing a monomer of the structural unit (A') and a monomer of the structural unit (B) or a combination thereof; or a method of polymerizing a monomer of the structural unit (B) or a combination thereof and reacting the obtained resin with a compound having a lactone structure.

In the method of obtaining the resin by copolymerizing a monomer of the structural unit (A') and a monomer of the structural unit (B) or a combination thereof, the resin of Formula (2) can be produced first, by reacting an acrylic compound such as acrylic acid, a halogenated acrylic acid and methacrylic acid with a lactone compound such as α-bromo-γ-butylolactone and α-bromo-δ-valerolactone to produce a monomer of the structural unit (A') and next, by copolymerizing the produced monomer with a monomer of the structural unit (B) of acrylic acid, a halogenated acrylic acid, methacrylic acid or an ester thereof, or a combination thereof.

On the other hand, the resin of Formula (2) can be produced by polymerizing a monomer of the structural unit (B) or a combination thereof and by reacting the obtained polymer with a lactone compound such as α-bromo-γ-butylolactone and α-bromo-δ-valerolactone.

The content of the structural units (A') and (B) is expressed in a unit of mol %, however, when the content is expressed in a unit of % by mass, the value represents the same value.

The polymers of Formula (1) and Formula (2) may be any of a random copolymer, a block copolymer and a graft copolymer. The polymer forming the resist underlayer film of the present invention can be synthesized by a method such as a radical polymerization, an anion polymerization and a cation polymerization. As the form of the polymerization, possible are various methods such as a solution polymerization, a suspension polymerization, an emulsion polymerization and a bulk polymerization.

The resist underlayer film used in the present invention is preferably crosslinked in terms of preventing an intermixing with a photoresist film overcoated on the underlayer film and for that purpose, the resist underlayer film contains a crosslinker. After a resist underlayer film forming composition is applied on a semiconductor substrate, by irradiating light to the coated substrate, a crosslinkage is formed between a polymer and a crosslinker by an acid generated from a photoacid generator contained in the resist underlayer film forming composition. In this crosslinkage formation, the crosslinking is progressed by further heating at such a low temperature of around 110° C. Accordingly, the resist underlayer film forming composition used in the present invention contains a crosslinker component. Examples of the crosslinker include a melamine series, a substituted urea series and a polymer series thereof. Preferred is a crosslinker having at least two crosslinkage-forming substituents and examples thereof include compounds such as methoxy-methylated glycoluril, butoxy-methylated glycoluril, methoxy-methylated melamine, butoxy-methylated melamine, methoxymethyl benzoguanamine, butoxymethyl benzoguanamine, methoxymethyl urea, butoxymethyl urea, methoxymethyl thiourea or butoxymethyl thiourea. In addition, condensates of these compounds can also be used. The additive amount of the crosslinker varies depending on the coating solvent used, the base substrate used, the required solution viscosity, the required film shape or the like, however, is 0.001 to 80% by mass, preferably 0.01 to 50% by mass, more preferably 0.05 to 40% by mass, based on the mass of the total solid content. These crosslinkers may cause a crosslinking reaction by a self-condensation, however, when crosslinking substituents are present in the polymer used in the present invention, these crosslinkers can cause a crosslinking reaction with these crosslinking substituents.

The crosslinker preferably causes a crosslinking reaction with a polymer of Formula (1) or Formula (2), accordingly, it is preferred that a functional group (for example, a hydroxyl group) capable of causing a crosslinking reaction is present in any of the structural unit (A), the structural unit (A') and the structural unit (B) or in both of them.

The polymer used in the resist underlayer film forming composition of the present invention can be produced also by copolymerizing a monomer forming the structural unit (A) for forming a polymer of Formula (1) or a monomer forming the structural units (A') and (B) for forming a polymer of Formula (2), further with a non-crosslinking monomer, and by this copolymerization, a fine control of the dry etching rate, the reflection rate, and the like can be performed. Examples of such a copolymerization monomer include compounds having one addition-polymerizable unsaturated bond selected from acrylic esters, acrylamides, methacrylate esters, methacrylamides, allyl compounds, vinyl ethers, vinyl esters, styrenes, crotonic esters, and the like.

Examples of the acrylic esters include alkyl acrylates having 1 to 10 carbon atoms in an alkyl group thereof.

Examples of the methacrylate esters include alkyl methacrylates having 1 to 10 carbon atoms in an alkyl group thereof.

Examples of the acrylamides include acrylamide, N-alkyl acrylamide, N-aryl acrylamide, N,N-dialkyl acrylamide, N,N-diaryl acrylamide, N-methyl-N-phenyl acrylamide and N-2-acetoamideethyl-N-acetylacrylamide.

Examples of the methacrylamides include methacrylamide, N-alkyl methacrylamide, N-aryl methacrylamide, N,N-dialkyl methacrylamide, N,N-diaryl methacrylamide, N-methyl-N-phenyl methacrylamide and N-ethyl-N-phenyl methacrylamide.

Examples of the vinyl ethers include alkyl vinyl ether and vinyl aryl ether.

Examples of the vinyl esters include vinyl butylate, vinyl i-butylate and vinyl trimethyl acetate.

Examples of the styrenes include styrene, alkylstyrene, alkoxystyrene, halogenated styrene and carboxystyrene.

Examples of the crotonate esters include alkyl crotonates such as butyl crotonate, hexyl crotonate and glycerin monocrotonate.

In addition, examples of the above copolymerization monomer include dialkyl itaconates, dialkyl esters or monoalkyl esters of maleic acid or fumaric acid, crotonic acid, itaconic acid, maleic anhydride, lactone, acrylonitrile, methacrylonitrile and maleilonitrile. As other examples, compounds can be used so long as the compound is generally an addition-polymerizable unsaturated compound copolymerizable with a monomer forming the structural unit (A) or monomers forming the structural units (A') and (B).

To the resist underlayer film forming composition used in the present invention, a photoacid generator can be added for accelerating a crosslinking reaction between the polymer and the crosslinker. Examples of such a photoacid generator include onium salt compounds, sulfonimide compounds and disulfonyl diazomethane compounds.

Examples of the onium salt compound include: iodonium salt-based acid generators such as diphenyliodonium hexafluorophosphate, diphenyliodonium trifluoromethanesulfonate, diphenyliodonium nonafluoro-n-butanesulfonate, diphenyliodonium perfluoro-n-octanesulfonate, diphenyliodonium camphorsulfonate, bis(4-t-butylphenyl)iodonium camphorsulfonate and bis(4-tert-butylphenyl)iodonium trifluoromethanesulfonate; and sulfonium salt-based acid generators such as triphenylsulfonium hexafluoroantimonate, triphenylsulfonium nonafluoro-n-butanesulfonate, triphenylsulfonium camphorsulfonate and triphenylsulfonium trifluoromethanesulfonate.

Examples of the sulfonimide compound include N-hydroxysuccinimide trifluoromethanesulfonate, N-(trifluoromethanesulfonyloxy)succinimide, N-(nonafluoro-n-butanesulfonyloxy)succinimide, N-(camphorsulfonyloxy)succinimide and N-(trifluoromethanesulfonyloxy)naphthalimide.

Examples of the disulfonyl diazomethane compound include bis(trifluoromethylsulfonyl)diazomethane, bis(cyclohexylsulfonyl)diazomethane, bis(phenylsulfonyl)diazomethane, bis(p-toluenesufonyl)diazomethane, bis(2,4-dimethylbenzenesulfonyl)diazomethane and methylsulfonyl-p-toluenesulfonyl diazomethane.

In addition, examples of the photoacid generator also include: sulfonate ester compounds such as benzoin tosylate, pyrogallolmethanesulfonic acid triester and nitrobenzyl-9,10-diethoxyanthracene-2-sulfonate; and halogen compound-based photoacid generator such as phenyl-bis(trichloromethyl)-s-triazine.

These photoacid generators can be used individually or in combination of two or more types thereof.

The content of the photoacid generator in the resist underlayer film forming composition used in the present invention is, for examples, 0.01 to 10% by mass, or 0.1 to 5% by mass, or 0.5 to 3% by mass, based on the mass of the solid content.

In addition, as a catalyst for accelerating the crosslinking reaction, there can be blended acidic compounds such as p-toluenesulfonic acid, trifluoromethane sulfonic acid, pyridinium-p-toluenesulfonic acid, salicylic acid, sulfosalicylic acid, citric acid, benzoic acid, hydroxybenzoic acid, naphthalenecarboxylic acid and/or thermoacid generator such as 2,4,4,6-tetrabromocyclohexadienone, benzoin tosylate, 2-nitrobenzyl tosylate and other organic sulfonic acid alkyl esters. The blending amount is 0.0001 to 20% by mass, preferably 0.0005 to 10% by mass, based on the mass of the total solid content.

Examples of the solvent that can be used for dissolving the polymer, the crosslinker component and the photoacid generator include ethylene glycol monomethyl ether, ethylene glycol monoethyl ether, methylcellosolve acetate, ethylcellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate and butyl lactate. These organic solvents can be used individually or in combination of two or more types thereof.

Further, the organic solvent can be used by mixing a high boiling point solvent such as propylene glycol monobutyl ether and propylene glycol monobutyl ether acetate thereto. Among these solvents, propylene glycol monomethyl ether, propylene glycol monomethyl ether acetate, ethyl lactate, butyl lactate, cyclohexanone, and the like are preferred for enhancing the leveling property.

To the resist underlayer film forming composition used in the present invention, further a light absorbing agent, a rheology controlling agent, an adhesion auxiliary agent, a surfactant, and the like can be added.

As the light absorbing agent, for example commercially available light absorbing agents described in "Technology and market of dyes for the industry" (CMC Publishing Co., Ltd.) and "Handbook for dyes" (edited by The Society of Synthetic Organic Chemistry, Japan) can be preferably used. The preferred examples of these light absorbing agents include: C.I. Disperse Yellow 1, 3, 4, 5, 7, 8, 13, 23, 31, 49, 50, 51, 54, 60, 64, 66, 68, 79, 82, 88, 90, 93, 102, 114 and 124; C.I. Disperse Orange 1, 5, 13, 25, 29, 30, 31, 44, 57, 72 and 73; C.I. Disperse Red 1, 5, 7, 13, 17, 19, 43, 50, 54, 58, 65, 72, 73, 88, 117, 137, 143, 199 and 210; C.I. Disperse Violet 43; C.I. Disperse Blue 96; C.I. Fluorescent Brightening Agent 112, 135 and 163; C.I. Solvent Orange 2 and 45; C.I. Solvent Red 1, 3, 8, 23, 24, 25, 27 and 49; C.I. Pigment Green 10; and C.I. Pigment Brown 2. The light absorbing agent is blended generally in an amount of 10% by mass or less, preferably 5% by mass or less, based on the mass of the total solid content.

The rheology controlling agent is added for the purpose of enhancing the fluidity of the resist underlayer film forming composition, and particularly of enhancing the homogeneity of the film thickness during baking. Specific examples thereof can include: phthalic acid derivatives such as dimethyl phthalate, diethyl phthalate, diisobutyl phthalate, dihexyl phthalate and butylisodecyl phthalate; adipic acid derivatives such as di-n-butyl adipate, diisobutyl adipate, diisooctyl adipate, octyldecyl adipate; maleic acid derivatives such as di-n-butyl maleate, diethyl maleate and dinonyl maleate; oleic acid derivatives such as methyl oleate, butyl oleate, tetrahydrofurfuryl oleate; or stearic acid derivatives such as n-butyl stearate and glyceryl stearate. These rheology controlling agents are blended generally in an amount of less than 30% by mass, based on the mass of the total solid content.

The adhesion auxiliary agent is blended for the purpose of enhancing the adhesion mainly with the substrate or a film in the underlayer, and particularly of causing no peeling of the photoresist in the development. Specific examples thereof can include: chlorosilanes such as trimethylchlorosilane, dimethylvinylchlorosilane, methyldiphenylchlorosilane and chloromethyldimethylchlorosilane; alkoxysilanes such as trimethylmethoxysilane, dimethyldiethoxysilane, methyldimethoxysilane, dimethylvinylethoxysilane, diphenyldimethoxysilane and phenyltriethoxysilane; silazanes such as hexamethyldisilazane, N,N'-bis(trimethlsilyl) urea, dimethyltrimethylsilylamine and trimethylsilylimidazol; silanes such as vinyltrichlorosilane, γ-chloropropyltrimethoxysilane, γ-aminopropyltriethoxysilane, γ-glycidoxypropyltrimethoxysilane; heterocyclic compounds such as benzotriazole, benzimidazole, indazole, imidazole, 2-mercaptobenzimidazole, 2-mercaptobenzothiazole, 2-mercaptobenzooxazole, urazole, thiouracil, mercaptoimidazole, mercaptopyrimidine; urea compounds such as 1,1-dimethyl urea and 1,3-dimethyl urea; or thiourea compounds. These adhesion auxiliary agents are blended in an amount of generally less than 5% by mass, preferably less than 2% by mass, based on the mass of the total solid content.

In the resist underlayer film forming composition used in the present invention, a surfactant can be blended for causing no pin hole, stration, and the like and for further enhancing the coating property relative to a surface unevenness. Examples of the surfactant can include: nonionic surfactants, for example, polyoxyethylene alkyl ethers such as polyoxyethylene lauryl ether, polyoxyethylene stearyl ether, polyoxyethylene cetyl ether and polyoxyethylene oleyl ether, polyoxyethylene alkylallyl ethers such as polyoxyethylene octylphenol ether and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; fluorine-based surfactants, for example EFTOP EF301, EF303 and EF352 (manufactured by Tohkem Products Co., Ltd.), MEGAFACE F171 and F173 (manufactured by DIC Corporation), Fluorad FC430 and FC431 (manufactured by Sumitomo 3M Limited), Asahi Guard AG710 and Surfron S-382, SC101, SC102, SC103, SC104, SC105 and SC106 (manufactured by Asahi Glass Co., Ltd.); and Organosiloxane polymer KP341 (manufactured by Shin-Etsu Chemical Co., Ltd.). The blending amount of these surfactants is generally 0.2% by mass or less, preferably 0.1% by mass or less, based on the mass of the total solid content. These surfactants can be added individually or in combination of two or more types thereof.

As a photoresist film used as an upper layer of the resist underlayer film in the present invention, both a negative-type and a positive-type can be used. Examples of the photoresist include: a positive-type photoresist containing a novolac resin and 1,2-naphthoquinonediazide sulfonate ester; a chemical amplification type photoresist containing a binder having a group elevating an alkali dissolving rate by being decomposed by an acid, and a photoacid generator; a chemical amplification type photoresist containing a low molecule compound elevating an alkali dissolving rate of a photoresist by being decomposed by an acid, an alkali-soluble binder and a photoacid generator; a chemical amplification type photoresist containing a binder having a group elevating an alkali dissolving rate by being decomposed by an acid, a low molecule compound elevating an alkali dissolving rate of a photoresist by being decomposed by an acid and a photoacid generator; and a photoresist having Si atoms in the skeleton thereof. Specific examples thereof include trade name: APEX-E manufactured by Rohm and Haas Company, trade name: PAR710 manufactured by Sumitomo Chemical Co., Ltd. and trade name: SEPR430 manufactured by Shin-Etsu Chemical Co., Ltd. In addition, other examples of the photoresist include a fluorine containing polymer-based photoresist described in Proc. SPIE, Vol. 3999, 330-334 (2000), Proc. SPIE, Vol. 3999, 357-364 (2000) and Proc. SPIE, Vol. 3999, 365-374 (2000).

The developer that can be used for the photoresist film of the present invention include: aqueous solutions of alkalis, for example, inorganic alkalis such as sodium hydroxide, potassium hydroxide, sodium carbonate, sodium silicate, sodium metasilicate, and ammonia water; primary amines such as ethylamine and n-propylamine; secondary amines such as diethylamine and di-n-butylamine; tertiary amines such as triethylamine and methyldiethylamine; alcohol amines such as dimethylethanolamine and triethanolamine; quaternary ammonium salts such as tetramethylammonium hydroxide, tetraethylammonium hydroxide and choline; and cyclic amines such as pyrrole and piperidine. Further, to an aqueous solution of the above alkalis, an appropriate amount of alcohols such as i-propyl alcohol and a surfactant of nonion-type or the like can be added to be used. Among these developers, a preferred developer is quaternary ammonium salts and more preferred developers are tetramethylammonium hydroxide and choline.

The method of producing the semiconductor device of the present invention includes: applying a resist underlayer film forming composition containing a polymer, a crosslinker and a photoacid generator on a semiconductor substrate to form a coating film; forming an underlayer film by irradiating light to the coating film; and forming a photoresist by applying a photoresist composition on the underlayer film and by heating the resultant coated substrate.

In more detail, the method of producing the semiconductor device includes: applying a resist underlayer film forming composition containing a polymer, a crosslinker and a photoacid generator on a semiconductor substrate to form a coating film; forming an underlayer film by irradiating light to the coating film; forming a photoresist by applying a photoresist composition on the underlayer film and by heating the resultant coated substrate; exposing the semiconductor substrate coated with the underlayer film and the photoresist to light; developing the photoresist after the exposure; dry etching the underlayer film using the developed resist pattern; and processing the semiconductor substrate with the obtained resist pattern.

On a semiconductor substrate (for example, silicon/silicon dioxide coated substrate, silicon wafer substrate, silicon nitride substrate, glass substrate, ITO substrate, polyimide substrate and low dielectric constant-material (low-k material) coated substrate) used for producing a semiconductor device, the resist underlayer film forming composition of the present invention is applied by an appropriate coating method such as a spinner and a coater to form a coating film. Then, before irradiating light to the coating film, as necessary, drying can be performed. In the case of a resist underlayer film forming composition containing a solvent, it is preferred that drying is performed.

Drying is not particularly limited so long as it is not a method of heating at a high temperature. When the coating film is heated at a high temperature (for example, a temperature of 150° C. or more), it is considered that the sublimation or the like of a solid content contained in the coating film is caused, so that the device is contaminated. Drying can be performed, for example, by heating the substrate on a hot plate at 50 to 110° C. for 1 to 10 minutes. In addition, it can be performed, for example, by air-drying the substrate at room temperature (around 20° C.).

Next, light is irradiated to the coating film. The method of irradiating light is not particularly limited to be used so long as the method can generate an acid from a photoacid generator. The light irradiation can be performed, for example, by using light having a wavelength of 150 nm to 1,000 nm, or 193 to 700 nm, or 200 to 600 nm with an exposure amount of 1 to 2,000 mJ/cm$^2$, or 10 to 1,500 mJ/cm$^2$, or 50 to 1,000 mJ/cm$^2$. The light irradiation can be performed, for example by using an ultra-high pressure mercury lamp, a flash UV lamp, a high pressure mercury lamp, a low pressure mercury lamp, a DEEP-UV (deep ultra violet) lamp, a xenon short arc lamp, a short arc metal halide lamp, a YAG laser exciting lamp and a xenon flash lamp. The light irradiation can be performed, for example by using an ultra-high pressure mercury lamp and by irradiating lights having all wavelengths in a range of around 250 nm to around 650 nm including a bright line spectrum having peaks at wavelengths of 289 nm, 297 nm, 303 nm, 313 nm (j line), 334 nm and 365 nm (i line) in an ultraviolet region and 405 nm (h line), 436 nm (g line), 546 nm and 579 nm in a visible light region.

When a resist underlayer film forming composition containing a polymer, a crosslinker and a photoacid generator is applied on a semiconductor substrate and an underlayer film is formed by irradiating light, a post exposure bake can also be performed. The bake is performed under conditions appropriately selected from baking temperatures of 70° C. to 110° C. and baking times of 0.3 to 10 minutes.

By irradiating light, an acid is generated from a photoacid generator and by the generated acid, a crosslinking reaction between a polymer and a crosslinker in a coating film is effected. Then, as a result of the crosslinking reaction, a resist underlayer film is formed. The thus formed resist underlayer film has low solubility against a solvent used in a photoresist composition applied on an upper layer of the underlayer film. Examples of the solvent include ethylene glycol monomethyl ether, ethylcellosolve acetate, diethylene glycol monoethyl ether, propylene glycol, propylene glycol monomethyl ether, propylene glycol monomethyl ether acetate, propylene glycol propyl ether acetate, toluene, methyl ethyl ketone, cyclohexanone, ethyl 2-hydroxypropionate, ethyl 2-hydroxy-2-methylpropionate, ethyl ethoxyacetate, methyl pyruvate, ethyl lactate and butyl lactate. Therefore, the resist underlayer film formed from the resist underlayer film forming composition used in the present invention causes no intermixing with a photoresist.

The resist underlayer film forming composition used in the present invention can be applied to a semiconductor substrate having holes which have an aspect ratio expressed by height/diameter of 1 or more, for example, 1 to 10 and 2 to 5. Then, the resist underlayer film forming composition used in the present invention can be used for filling such holes with the underlayer film without causing voids. In addition, the resist underlayer film forming composition of the present invention can be applied to a semiconductor substrate having holes which have an aspect ratio of 1 or more sparsely or densely (a substrate having both parts in which holes are present densely and parts in which holes are present sparsely). Then, the resist underlayer film forming composition of the present invention can be used for forming a planar underlayer film on the surface of a substrate in which such holes are present sparsely or densely.

In addition, the resist underlayer film forming composition of the present invention can also be used for a semiconductor substrate having holes which have an aspect ratio of less than 1 or a semiconductor substrate having steps. Further, it can also be used for a semiconductor substrate having no step or the like.

The resist underlayer film formed from the resist underlayer film forming composition of the present invention has a film thickness on the surface of the substrate of, for example, 20 to 2,000 nm, or 30 to 1,000 nm, or 50 to 800 nm.

Next, a photoresist is formed on the resist underlayer film. Consequently, a laminate structure of the resist underlayer film and the photoresist is formed on a semiconductor substrate. The formation of the photoresist can be performed by a known method, that is, by applying a photoresist composition solution on a resist underlayer film and by heating the composition.

Next, the exposure is performed through a predetermined mask. For the exposure, a KrF excimer laser (wavelength: 248 nm), an ArF excimer laser (wavelength: 193 nm), an F2 excimer laser (wavelength: 157 nm), and the like can be used. After the exposure, as necessary, post exposure bake can also be performed. The conditions of the post exposure bake are appropriately selected from baking temperatures of 70° C. to 150° C. and baking times of 0.3 minutes to 10 minutes.

Next, development is performed with a developer. Consequently, for example when a positive-type photoresist is used, a photoresist at an exposed part is removed to form a photoresist pattern. The conditions of development are appropriately selected from temperatures of 5° C. to 50° C. and times of 0.1 minutes to 5 minutes.

Then, using the thus formed photoresist pattern as a protecting film, the resist underlayer film is removed and the semiconductor substrate is processed. The removal of the resist underlayer film can be performed by dry etching using a gas such as tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride and chlorine trifluoride. By the removal of the resist underlayer film, a pattern composed of a resist underlayer film and a photoresist is formed on a semiconductor substrate.

In addition, before the photoresist is formed, a reflection preventing film layer can be formed on the resist underlayer film of the present invention. The reflection preventing film is not particularly limited and an existing reflection preventing film can be used. For example, with using a composition for forming a reflection preventing film which has been conventionally used in a lithography process and by a conventionally used method such as applying on an underlayer film with a spinner or coater and calcining, the reflection preventing film can be formed. Examples of the reflection preventing film composition include: those containing mainly light absorbing compounds, resins and solvents; those containing mainly resins having a light absorbing group linked by a chemical bond, crosslinkers and solvents; those containing mainly light absorbing compounds, crosslinkers and solvents; and those containing mainly polymer crosslinkers having light absorptivity and solvents. These reflection preventing film compositions may also contain, as necessary, acid components, acid generator components, rheology controlling agents, or the like. The light absorbing compound can be used so long as it has high absorptivity to light in a photosensitivity wavelength region of photosensitive components in a photoresist provided on a reflection preventing film and examples thereof include benzophenone compounds, benzotriazole compounds, azo compounds, naphthalene compounds, anthracene compounds, anthraquinone compounds and triazine compounds. Examples of the resin include polyesters, polyimides, polystyrenes, novolac resins, polyacetal resins and acrylic resins. The resin having a light absorbing group linked by a chemical bond can include resins having a light absorbing aromatic ring structure such as an anthracene ring, a naphthalene ring, a benzene ring, a quinoline ring, a quinoxaline ring and a thiazole ring.

Further, before the resist underlayer film forming composition of the present invention is applied, a reflection preventing film or a planarizing film can be formed on a semiconductor substrate.

The resist underlayer film formed from the resist underlayer film forming composition of the present invention may absorb light used in a lithography process depending on the wavelength of the light. In such a case, the resist underlayer film can function as a layer having an effect of preventing a reflecting light from the substrate, that is, as a reflection preventing film. Further, the resist underlayer film of the present invention can be used as a layer for preventing an interaction between the substrate and the photoresist, a layer for preventing an adverse action of substances generated during the exposure of materials used for the photoresist or of the photoresist to light, against the semiconductor substrate, and a layer for preventing diffusion of substances generated from the semiconductor substrate during the heating calcination to the upper layer photoresist.

Hereinafter, the present invention will be more specifically described referring to Examples which should not be construed as limiting the scope of the present invention.

EXAMPLES

Synthesis Example 1

6.6 g (0.039 mol) of butylolactone methacrylate of Formula (3):

[Chemical Formula 3]

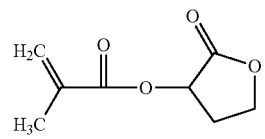

Formula (3)

6.6 g (0.046 mol) of hydroxypropyl methacrylate and 6.8 g (0.039 mol) of benzyl methacrylate were dissolved in 64.4 g of tetrahydrofuran and then the inside of a flask was replaced by nitrogen, followed by elevating the temperature of the solution to a reflux temperature. After the start of the reflux, 0.2 g of azobis-isobutylonitrile (AIBN) dissolved in 10 g of tetrahydrofuran was added to the reaction solution under nitrogen pressure and the reaction was effected for 24 hours. The reaction solution was cooled and then charged into diethyl ether, and a polymer was reprecipitated therein. The obtained polymer was dried by heating and a resin of Formula (4) was obtained. The obtained resin had a polymerization degree of 490, a weight average molecular mass Mw of 80,000 (converted into the mass of polystyrene), a molar ratio x:y1:y2 of 31%:38%:31% and a yield of 90%.

[Chemical Formula 4]

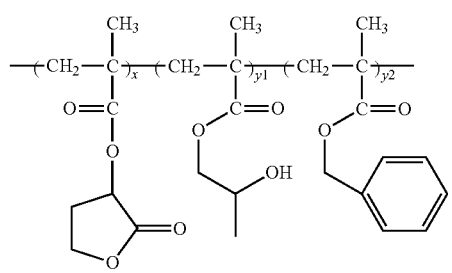

Formula (4)

Example 1

To 8.0 g of an ethyl lactate solution (solid content concentration: 20.0%) containing 1.6 g of the resin obtained in Synthesis Example 1, 0.4 g of tetramethoxymethyl glycoluryl as a crosslinker and 0.03 g of triphenylsulfonium trifluoromethanesulfonate as a photoacid generator were blended. The resultant reaction mixture was dissolved in 55 g of propyleneglycol monomethyl ether acetate and 6.5 g of ethyl lactate which are reaction solvents to prepare a 10.0% solution. Thereafter, the solution was filtered, first by using a polyethylene-made microfilter having a pore diameter of 0.10 μm, and next by using a polyethylene-made microfilter having a pore diameter of 0.05 μm to prepare a resist underlayer film forming composition.

Comparative Example 1

To 8.0 g of an ethyl lactate solution (solid content concentration: 20.0%) containing 1.6 g of the resin obtained in Synthesis Example 1, 0.4 g of tetramethoxymethyl glycoluryl as a crosslinker and 0.03 g of p-toluenesulfonic acid as a crosslinking catalyst were blended. The resultant reaction mixture was dissolved in 55 g of propyleneglycol monomethyl ether acetate and 6.5 g of ethyl lactate which are reaction solvents to prepare a 10.0% solution. Thereafter, the solution was filtered, first by using a polyethylene-made microfilter having a pore diameter of 0.10 μm, and next by using a polyethylene-made microfilter having a pore diameter of 0.05 μm to prepare a resist underlayer film forming composition.

(Measurement of Optical Parameter)

The solution of the resist underlayer film forming composition prepared in Example 1 was applied on a silicon wafer by using a spinner. To the resultant coating film, by using an ultra-high pressure mercury lamp (manufactured by Ushio Inc.; model: UIS-5011 MIKY; output: 500 W), all wavelengths of light passed through a band-pass filter of 248 nm were irradiated for 3 minutes (exposure amount: 50 mJ/cm$^2$). Thereafter, the coating film was heated on a hot plate at 110° C. for 1 minute to form a resist underlayer film (having a film thickness of 145 nm). Then, the refractive index (n value) and the attenuation coefficient (k value) at a wavelength of 193 nm of the resist underlayer film were measured by using a spectroscopic elipsometer and found to be 1.82 and 0.34, respectively.

In a similar manner as above described, the refractive index (n value) and the attenuation coefficient (k value) at 193 nm of the resist underlayer film obtained from the resist underlayer film forming composition of Comparative Example 1 were measured, and found to be 1.82 and 0.34, respectively.

(Test for Intermixing with Photoresist)

The solution of the resist underlayer film forming composition prepared in Example 1 was applied on a silicon wafer by using a spinner. To the resultant coating film, by using an ultra-high pressure mercury lamp (manufactured by Ushio Inc.; model: UIS-5011 MIKY; output: 500 W), all wavelengths of light passed through a band-pass filter of 248 nm were irradiated for 3 minutes (exposure amount: 50 mJ/cm$^2$). Thereafter, the coating film was heated on a hot plate at 110° C. for 1 minute to form an underlayer film (having a film thickness of 145 nm). On an upper layer of the resist underlayer film, a commercially available photoresist solution (trade name: PAR710; manufactured by Sumitomo Chemical Co., Ltd.) was applied with a spinner. The coating film was heated on a hot plate at 90° C. or 110° C. for 1.5 minutes. After exposing the photoresist to light, post exposure bake was performed at 90° C. for 1.5 minutes. After developing the photoresist, the film thickness of the resist underlayer film was measured to confirm that the intermixing of the resist underlayer film with the photoresist does not occur.

(Measurement of Dry Etching Rate)

The solution of the resist underlayer film forming composition obtained in Example 1 was applied on a silicon wafer with a spinner. To the resultant coating film, by using an ultra-high pressure mercury lamp (manufactured by Ushio Inc.; model: UIS-5011 MIKY; output: 500 W), all wavelengths of light passed through a band-pass filter of 248 nm were irradiated for 3 minutes (exposure amount: 50 mJ/cm$^2$). Thereafter, the coating film was heated on a hot plate at 110° C. for 1 minute to form a resist underlayer film (having a film thickness of 145 nm). Then, the dry etching rate of the underlayer film was measured by using RIE system ES401, manufactured by Nippon Scientific Co., Ltd. under a condition where $CF_4$ was used as a dry etching gas. The dry etching selectivity corresponds to the dry etching rate of the resist underlayer film. When the dry etching rate of a commercially available photoresist solution (trade name: PAR710; manufactured by Sumitomo Chemical Co., Ltd.) is assumed to be 1.00, the dry etching rate of the resist underlayer film obtained from the resist underlayer film forming composition of Example 1 was 1.40.

In a similar manner as above described, the dry etching rate of the resist underlayer film obtained from the resist underlayer film forming composition of Comparative Example 1 was measured, and found to be 1.40.

It was confirmed that the etching rate of the resist underlayer film obtained from the resist underlayer film forming composition in Example 1 is larger than that of the photoresist. The dry etching rate of the resist underlayer film needs to be higher than that of the photoresist, because in the process of developing the photoresist formed on the resist underlayer film and of exposing the base substrate by dry etching thereafter, with the dry etching rate of the resist underlayer film higher than the dry etching rate of the photoresist, the underlayer film is removed before the photoresist is scraped away. Accordingly, the pattern of the developed photoresist can be accurately transferred to the substrate.

(Comparison of Sublimate During Curing)

The amount of sublimates was measured by a method including: attaching a sublimate generated from a resist underlayer film during heating to the surface of a quartz crystal microbalance (QCM sensor) by a nozzle incorporated in a detection part; and measuring the amount of sublimates in real time according to the time course of heating time from the change in the resonance frequency corresponding to the amount of the sublimate attached to the quartz crystal microbalance.

The resist underlayer film forming composition of Example 1 was applied on a silicon wafer substrate having a diameter of 4 inches by a spin coater. Then, for removing a solvent to dry the composition, the coated substrate was heated on a hot plate at 100° C. for one minute. Next, to the resultant coating film, by using an ultra-high pressure mercury lamp (manufactured by Ushio Inc.; model: UIS-5011 MIKY; output: 500 W), all wavelengths of light passed through a band-pass filter of 248 nm were irradiated for 3 minutes (exposure amount: 50 mJ/cm$^2$) to form a resist underlayer film (having a film thickness of 145 nm) by photo-crosslinking curing. The wafer coated with the resist underlayer film was set in a sublimate measuring apparatus in which a hot plate is incorporated to collect sublimates on a QCM sensor.

The resist underlayer film forming composition of Comparative Example 1 was applied on a silicon wafer substrate having a diameter of 4 inches by a spin coater. Then, for removing a solvent to dry the composition, the coated substrate was heated on a hot plate at 205° C. for one minute to form a resist underlayer film (having a film thickness of 145 nm) by thermal crosslinking curing. The wafer coated with the resist underlayer film was set in a sublimate measuring apparatus in which a hot plate is incorporated to collect sublimates on a QCM sensor.

In the measurement of the resist underlayer film forming composition obtained in Example 1, the temperature of a hot plate was elevated to 100° C. and the flow rate of a pump was set at 1 m$^3$/s, followed by allowing the apparatus to stand for the beginning 60 seconds for aging. Thereafter immediately, a wafer coated with a resist underlayer film was swiftly put on the hot plate through a sliding input (the object to be measured was installed) and sublimates of from a time point of 60 seconds to a time point of 180 seconds (for 60 seconds) were collected on a QCM sensor.

In the measurement of the resist underlayer film forming composition obtained in Comparative Example 1, the temperature of a hot plate was elevated to 205° C. and the flow rate of a pump was set at 1 m$^3$/s, followed by allowing the apparatus to stand for the beginning 60 seconds for aging. Thereafter immediately, a wafer coated with a resist underlayer film was swiftly put on the hot plate through a sliding input (the object to be measured was installed) and sublimates of from a time point of 60 seconds to a time point of 180 seconds (for 60 seconds) were collected on a QCM sensor.

In addition, since a nozzle was not attached to a flow attachment (detection part), the aperture of the flow attachment is 32 mm, so that through a flow path between a sensor and a chamber unit distant from the sensor by 30 mm, a stream flowed into the detection part without being narrowed. In addition, as the QCM sensor, used was an electrode made of an aluminum-silicon material in which a quartz crystal microbalance has a diameter (sensor diameter) of 14 mm; an electrode on the surface of the quartz crystal microbalance has a diameter of 5 mm; and the resonance frequency is 9 MHz.

In each measurement, in order for the QCM sensor to be able to measure the sublimate in real time, the QCM sensor was connected with a personal computer through a serial cable so that the data can be directly retrieved in the personal computer and a dedicated software was installed.

The obtained change in the frequency was converted into grams using a fixed value of the quartz crystal microbalance used in the measurement to measure the amount of sublimates generated from one piece of the wafer coated with a resist underlayer film after heating for 60 seconds.

The amount of sublimates generated from the resist underlayer films obtained from the resist underlayer film forming compositions of Example 1 and Comparative Example 1 was measured by using a sublimate measuring apparatus according to a method in which the sublimates are collected on a QCM sensor, and it has become apparent that the amount of sublimates generated from the resist underlayer film produced by photo-crosslinking curing shown in Example 1 is extremely smaller than the amount of sublimates generated from the resist underlayer film produced by thermal crosslinking curing shown in Comparative Example 1.

The invention claimed is:

1. A method of producing a semiconductor device comprising:

forming a coating film by applying a resist underlayer film forming composition containing a polymer, a crosslinker and a photoacid generator on a semiconductor substrate;

forming an underlayer film by irradiating light to the coating film;

forming a photoresist by applying a photoresist composition on the underlayer film and heating the resultant layer;

exposing the semiconductor substrate coated with the underlayer film and the photoresist to light;

developing the photoresist after the exposure;

dry etching the underlayer film using a developed resist pattern; and processing the semiconductor substrate with the obtained resist pattern, wherein the polymer consists of unit structures selected from the group consisting of a unit structure of Formula (1) having a hydroxyl group:

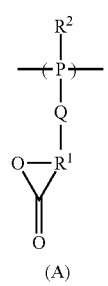

Formula (1)

(A)

wherein Q represents a divalent linking group linking P with R$^1$ ; R$^1$ represents a trivalent hydrocarbon group having 2 to 4 carbon atoms; P represents a bonding group constituting a main chain; and R$^2$ represents a hydrogen atom, a methyl group or a halogen atom; and a unit structure of Formula (2) having a hydroxyl group:

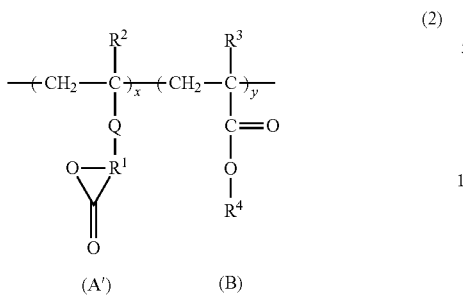

(2)

wherein x and y represent the number of repeating units and x=5 to 5,000, y=2 to 5,000; Q represents a divalent linking group linking a carbon atom constituting a main chain with $R^1$; $R^1$ represents a trivalent hydrocarbon group having 2 to 4 carbon atoms; $R^2$ and $R^3$ represent a hydrogen atom, a methyl group or a halogen atom; $R^4$ represents a hydrogen atom, an unsubstituted or substituted alkyl group having 1 to 10 carbon atoms, an unsubstituted or substituted aralkyl group, an unsubstituted or substituted carbocyclic aromatic group, or an unsubstituted or substituted heterocyclic aromatic group; and an amount of a structural unit (A') is 1 to 76 mol % and an amount of a structural unit (B) is 99 to 24 mol %.

2. The method of producing a semiconductor device according to claim 1, wherein the polymer has a structure having absorption at 248 nm, 193 nm and 157 nm.

3. The method of producing a semiconductor device according to claim 1, wherein the crosslinker has at least two crosslinkage forming functional groups.

* * * * *